United States Patent
Singh (10) Patent No.: US 7,610,523 B1
(45) Date of Patent: Oct. 27, 2009

(54) METHOD AND TEMPLATE FOR PHYSICAL-MEMORY ALLOCATION FOR IMPLEMENTING AN IN-SYSTEM MEMORY TEST

(75) Inventor: Amandeep Singh, Fremont, CA (US)

(73) Assignee: Sun Microsystems, Inc., Menlo Park, CA (US)

( * ) Notice: Subject to any disclaimer, the term of this patent is extended or adjusted under 35 U.S.C. 154(b) by 262 days.

(21) Appl. No.: 11/352,085

(22) Filed: Feb. 9, 2006

(51) Int. Cl.
*G11C 29/00* (2006.01)
(52) U.S. Cl. .................. 714/718; 365/200; 365/201
(58) Field of Classification Search ............... 714/718; 365/201
See application file for complete search history.

(56) References Cited

U.S. PATENT DOCUMENTS

| | | | |
|---|---|---|---|
| 5,603,011 A * | 2/1997 | Piazza ........................ | 711/170 |
| 5,881,221 A * | 3/1999 | Hoang et al. .................. | 714/42 |
| 2005/0055674 A1 * | 3/2005 | Shidla et al. ................. | 717/131 |

* cited by examiner

*Primary Examiner*—Kevin L Ellis
*Assistant Examiner*—Daniel F McMahon
(74) *Attorney, Agent, or Firm*—Gunnison, McKay & Hodgson, L.L.P.; Philip J. McKay (57) ABSTRACT

An in-system memory testing method includes transparently selecting and "stealing" a portion of memory from the memory system for running memory tests, then running one or more of the numerous known memory system tests on the selected portion of memory, and then inserting the selected, and now tested, portion of memory back into the system for normal application use. The disclosed in-system memory testing method is capable of testing system memory in both offline and online environments, without imposing any additional hardware requirements or significantly affecting system performance. The disclosed in-system memory testing method is compatible with any conventional prior art functional test algorithm for in-system memory testing and can be performed under real life system environmental conditions. Therefore, the disclosed in-system memory testing method complements other test techniques like BIST/POST that are conventionally used only at the time of system boot up.

18 Claims, 4 Drawing Sheets

Test v/s App-1

FIG. 4

Test v/s App-2

FIG. 5

Test v/s App-1 v/s App-2

FIG. 6

METHOD AND TEMPLATE FOR PHYSICAL-MEMORY ALLOCATION FOR IMPLEMENTING AN IN-SYSTEM MEMORY TEST

BACKGROUND OF THE INVENTION

1. Field of the Invention

The present invention relates generally to memory systems and, more particularly, to memory system testing.

2. Description of Related Art

As consumer electronics continue to advance in capability, decrease in size, and permeate virtually every aspect of modern life, an increasingly higher percentage of integrated circuit chip area is being dedicated to memory cells. Likewise, system level memory is also increasing in capability and capacity. This increase in memory size and capacity is being made possible, in part, by advances in semiconductor technology that allow more transistors to be integrated into smaller and smaller integrated circuit chips, while keeping power dissipation, and heat production, under control through lower voltage levels. As a consequence, modern memory systems are becoming more and more susceptible to failures due to functional imperfections in the chips incurred during chip fabrication, exposure to cosmic radiation during fabrication and operation, and other environmental conditions and stresses incurred during fabrication and/or operation.

The need for memory testing was well established even before recent increases in memory size and capacity. However, the recent increases have made memory testing even more critical. As a result, significant energy and resources have been devoted to memory testing in the recent past and numerous publications on the subject, and several prior art methods, have evolved.

In the prior art, tester-level memory testing was done by the memory chip, typically a DRAM chip, vendor, while system-level memory offline-mode testing like POST/BIST was commonly done by the computer system manufacturer during system manufacturing, new installation or reconfiguration. Generally, in the prior art, POST/BIST ran before the Operating System (OS) booted up on the computer system.

While prior art POST/BIST tests alone were effective at catching some faults, it is well known that different stress conditions like temperature, voltage, timing noise, and the like, also play an important role in creating, causing, and amplifying, certain failure mechanisms long after computer system boot up. Consequently, it is important to do some offline testing under simulated-real-life computer system environmental conditions, with the Operating System booted up and running, especially during the manufacturing of mission critical systems. However, even offline testing under simulated-real-life environmental conditions is not enough by itself because there is a constant Mean Time Between Fails (MTBF) associated with all components in a computer system, and particularly in a memory system. Therefore, faults can develop anytime during the operational life of the computer and/or memory system.

In addition, with decreasing physical memory cell area, and the decreasing amount of charge stored by the memory cell, i.e., decreasing threshold voltages, cosmic radiation is becoming more of a concern and radiation induced single and multiple bit errors are now common, even at sea level operation. Permanent damage due to single ion impacts is also known to occur in memory devices. It is therefore necessary to have some mechanism for online testing, i.e., testing under real-life system loads and conditions, and error handling to maintain the high computer and/or memory system availability now required in the industry.

In the prior art, system memory has typically also been protected by parity and/or Error Correction Code (ECC). While parity provides only single bit error detection, ECC is typically implemented as Hamming Code, providing Single bit Error Correction and Double bit Error Detection (SECDED) capabilities at the expense of additional redundant bits, as compared to the single bit required for parity. However, this prior art approach, when used alone, provides only passive protection and ECC error correction takes place only when data is read. Consequently, in the prior art, Uncorrectable Errors (UEs) often occurred due to accumulation of multiple single bit errors between successive reads. To reduce the probability of such accumulation, many prior art systems implemented memory scrubbers.

A memory scrubber periodically reads through all of system memory and if it finds any single bit errors (for SECDED ECC), corrected data is written back, effectively cleaning up the error. While in the prior art SECDED ECC, coupled with memory scrubber techniques improved protection against single upsets, there was still vulnerability to faults that could cause multi-bit errors. Unfortunately, ECC codes like DECTED (Double Error Correct, Triple Error Detect), that, in theory, provided correction of more than one bit, were found to be inefficient with the additional check bits themselves being susceptible to the same faults.

What is needed is a method for in-system memory testing that is capable of testing system memory in both offline and online environments, without imposing any additional hardware requirements or significantly affecting normal computer or memory system operation and performance.

SUMMARY OF THE INVENTION

In accordance with one embodiment of the invention, an in-system memory testing method is capable of testing system memory in both offline and online environments, without imposing any additional hardware requirements or significantly affecting computer or memory system performance.

According to one embodiment of the invention, an in-system memory testing method includes transparently selecting and "stealing" a portion of physical memory from the system for testing, then running any one of numerous known memory system tests on the selected portion of memory, and then inserting the selected, and now tested, portion of physical memory back into the memory system for normal application use. As discussed in more detail below, experimental results have shown that implementation of one embodiment of the in-system memory testing method of the invention can significantly improve the computer system's ability to proactively detect and mange functional faults in memory.

In contrast to prior art methods, the memory test coverage of the in-system memory testing method of the present invention is deterministic and does not depend on memory or computer system load. In addition, the in-system memory testing method of the invention is compatible with any conventional prior art functional test algorithms for in-system memory testing. Since the in-system memory testing method of the invention can be performed under real life system environmental conditions, the in-system memory testing method of the invention complements other test techniques like BIST/POST that are conventionally used only at the time of computer system boot up. In addition, the in-system memory testing method of the invention can be used in both offline and online environments. When the in-system memory testing method of the invention is used in online mode, the in-system memory testing method can reduce error detection latency of functional faults that may otherwise get logically masked and go undetected by a "read" based memory scrubber or other prior art methods. The in-system memory testing method of the invention is also capable of providing improved application availability, even in the presence of defects that can cause uncorrectable (multiple bit) errors.

In addition, one embodiment of the in-system memory testing method of the invention is a software based in-system memory testing method that includes both offline mode testing, i.e., memory testing when customer applications are not running, and online mode testing, i.e., memory testing when customer applications are being run concurrently. The prior art includes a significant number of publications disclosing prior art test algorithms to detect such faults. The in-system memory testing method of the invention includes the transformation of these algorithms for in-system software based memory test. Consequently, the in-system memory testing method of the invention requires no new test algorithms other than those known to anyone of skill in the art.

In addition, modified embodiments of the in-system memory testing method of the invention are also capable of use with other system components and can be used for various other test/diagnostic applications such as: cache diagnostic testing; uniboard/bus testing; directed memory diagnostic testing; system ATE diagnostic testing; improved error diagnosis and various other system wide applications.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

In accordance with one embodiment of the invention, an in-system memory testing method (100 in FIG. 1) is capable of testing system memory in both offline and online environments, without imposing any additional hardware requirements or significantly effecting computer or memory system performance.

Figure 1:
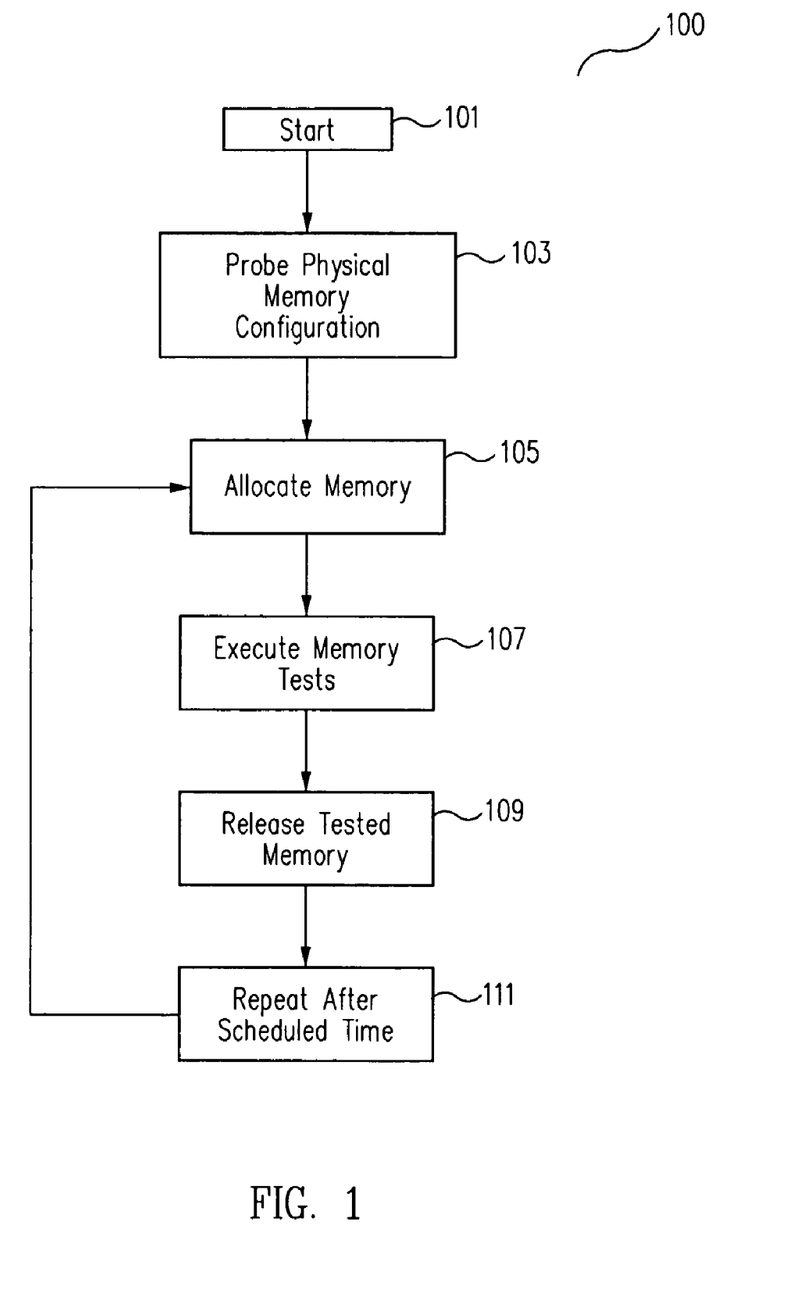
FIG. 1 shows a flow chart depicting an in-system memory test method in accordance with the principles of one embodiment of the invention.

According to one embodiment of the invention, an in-system memory testing method includes transparently selecting and "stealing" a portion of physical memory from the system for testing (105 in FIG. 1), then running any one of numerous known memory system tests on the selected portion of memory (107 in FIG. 1), and then inserting the selected, and now tested, portion of physical memory back into the memory system for normal application use (109 in FIG. 1). Experimental results (FIGS. 2, 3, 4, 5 and 6) show that implementation of one embodiment of the in-system memory testing method of the invention can significantly improve the computer system's ability to proactively detect and mange functional faults in memory.

In contrast to prior art methods, the memory test coverage of the in-system memory testing method of the present invention is deterministic and does not depend on memory or computer system load. In addition, the in-system memory testing method of the invention is compatible with any conventional prior art functional test algorithms for in-system memory testing. Since the in-system memory testing method of the invention can be performed under real life system environmental conditions, the in-system memory testing method of the invention complements other test techniques like BIST/POST that are conventionally used only at the time of computer system boot up. In addition, the in-system memory testing method of the invention can be used in both offline and online environments. When the in-system memory testing method of the invention is used in online mode, the in-system memory testing method can reduce error detection latency of functional faults that may otherwise get logically masked and go undetected by a "read" based memory scrubber or other prior art methods. The in-system memory testing method of the invention is also capable of providing improved application availability, even in the presence of defects that can cause uncorrectable (multiple bit) errors.

In addition, one embodiment of the in-system memory testing method of the invention is a software based in-system memory testing method that includes both offline mode testing, i.e., memory testing when customer applications are not running, and online mode testing, i.e., memory testing when customer applications are being run concurrently. The prior art includes a significant number of publications disclosing prior art test algorithms to detect such faults. The in-system memory testing method of the invention includes the transformation of these algorithms for in-system software based memory test. Consequently, the in-system memory testing method of the invention requires no new test algorithms other than those known to anyone of skill in the art.

In addition, modified embodiments of the in-system memory testing method of the invention are also capable of use with other system components and can be used for various other test/diagnostic applications such as: cache diagnostic testing; uniboard/bus testing; directed memory diagnostic testing; system ATE diagnostic testing; improved error diagnosis and various other system wide applications.

In particular, FIG. 1 shows a flow diagram of one embodiment of an in-system memory test method 100 of the invention. As shown in FIG. 1, in-system memory test method 100 begins at start 101 and in-system memory test method 100 flows to probe physical memory configuration operation 103. At probe physical memory configuration operation 103, according to one embodiment of the in-system physical memory test method 100 of the invention, the physical memory configuration is probed and test runs are scheduled to be executed in multiple iterations to cover 100% of the testable memory. According to one embodiment of the invention, for offline mode testing, in-system memory test method 100 can allocate as much physical memory as is available and test it all in one iteration. However, according to one embodiment of the invention, in an online environment, the system resource usage during test execution needs to be tunable such that testing can be scheduled during system idle times, such as at night, weekends, holidays or other periods of low usage, or the intensity of testing can be controlled to minimize the impact on computer system performance during other periods. Once the probe of the physical memory configuration is completed at probe physical memory configuration operation 103, in-system memory test method 100 flows to allocate memory operation 105.

As discussed in more detail below, at allocate memory operation 105, a selected portion of physical memory is allocated to be tested. The amount of memory allocated at allocate memory operation 105 can be specified either as an absolute value or as a percentage of entire physical memory. However, it must be borne in mind that a larger allocation size means that less physical memory will be left available for the system application software during the test procedure. In addition, at allocate memory operation 105, the time period between two successive test iterations is determined. Here too it must be borne in mind that a higher frequency will mean that the computer system will spend a higher percentage of processor time on running tests, rather than applications.

In one embodiment of the invention, the physical address of the selected portion of physical memory to be allocated at allocate memory operation 105 for testing is calculated based on iteration number and memory allocation size. Of course the physical address would also depend upon the memory configuration itself. According to one embodiment of the invention, the following relationship is used to calculate the allocation address:

$$\begin{matrix} \text{Allocation} \\ \text{Start Address} \end{matrix} = \begin{matrix} \text{Physical Memory} \\ \text{Start Address} \end{matrix} + \left( \begin{matrix} \text{Allocation} \\ \text{Size} \end{matrix} \times \begin{matrix} \text{Iteration} \\ \text{Number} \end{matrix} \right)$$

According to one embodiment of the invention, depending upon system application workload "iteration time-period" and "memory allocation size" is tuned to minimize the impact on the computer system performance while maintaining high-test coverage. In addition, the priority of the test process may be lowered to allow full processor resource access to the system application. An automated system load based test scheduler (not shown) would be one way to provide this capability.

By way of background, most of the Operating Systems (OSs) in use today, use Virtual Memory (VM) schemes and Virtual Memory management for efficient allocation of the computer system's physical memory, typically RAM, among different application processes. Use of a Virtual Memory scheme allows the Operating System to present a continuous address space to all processes. The address space (both virtual and physical) is divided into equal-sized portions or "chunks", called "pages". Consequently there exists both virtual and physical memory pages in the memory system. The mapping between virtual memory pages and physical memory pages is typically maintained by a Memory Management Unit (MMU) (not shown).

Use of Virtual Memory schemes also allows the Operating System to present more (virtual) memory to the process/application than the actual physical memory size could accommodate. This is done by keeping the most frequently used virtual memory pages mapped to the physical memory, while the lesser-used virtual memory pages can be swapped out to the disk, or other main memory/mass storage. This process is known as page-out. Virtual memory pages swapped on to the disk can also be mapped back into physical memory pages when needed by a process known as page-in. In the prior art, the paging in and paging out of virtual memory pages is typically done transparently with respect to the user process/application. Consequently, the virtual memory allocated by prior art memory test processes often got mapped to any physical page (address) and transparently moved to a different physical page by the Operating System. Clearly, both these prior art features had a potential for a significantly adverse effect on the coverage of the prior art memory test programs.

Conceptually speaking, the Operating System internally maintains a list of all physical memory pages available in the memory system, along with the information about their current use. In one embodiment of the invention, this fact is taken advantage of at allocate memory operation 105 and pages are moved from this "public/system" list to a separate "private/under test" list. Consequently, according to one embodiment of the invention, a page, or more, of physical memory is effectively temporarily removed or "stolen" from the memory system at allocate memory operation 105. As discussed in more detail below, then, according to one embodiment of the invention, the stolen page(s) are mapped to virtual memory space allocated to the test process at allocate memory operation 105 for executing the test algorithms in a virtual space removed from the rest of the memory system.

According to one aspect of one embodiment of the present invention, the in-system memory test method 100 of the invention requires that the desired physical pages be mapped to the virtual address space for testing. According to another aspect of one embodiment of the present invention, the in-system memory test method 100 of the invention also requires that the Operating System be prevented from paging-out the portion of physical memory under test. Consequently, the problems in the prior art, discussed above, associated with the paging in and paging out of virtual memory pages and the virtual memory allocated by a prior art system memory test process getting mapped to any physical memory page (address), and being transparently moved to a different physical memory page by the Operating System, is avoided using in-system memory test method 100 of the invention.

In one embodiment of the invention, the memory allocation functions of allocate memory operation 105 described above are implemented using a driver. Numerous embodiments of drivers can be created by those of skill in the art to accomplish the above functions. Consequently, specific details of any particular driver are not presented herein to avoid detracting from the present invention.

From allocate memory operation 105, in-system memory test method 100 flows to execute memory tests operation 107. As discussed in more detail below, at execute memory tests operation 107 the allocated physical memory portion mapped to the virtual memory space allocated in allocate memory operation 105 is tested in virtual space removed from the rest of the memory system.

According to one embodiment of in-system memory test method 100, core memory test algorithms are provided for use at execute memory tests operation 107. As noted above, the prior art includes a significant number of prior art test algorithms to detect various memory system faults. Consequently, in-system memory test method 100 includes the incorporation and/or transformation of these algorithms at execute memory tests operation 107 for use within the framework of in-system memory test method 100. These prior art test algorithms are well known to those of skill in the art and are therefore not discussed herein in more detail to avoid detracting from the present invention.

According to one embodiment of the invention, even if a physical memory page to be allocated at allocate memory operation 105 and tested at execute memory tests operation 107 is found to be in use by some other program, the physical memory page may still be allocated/tested. This is done, according to one embodiment of the invention, by using the Operating System's virtual memory management interfaces to copy the contents of the physical memory page in question to the swap device (page-out) at allocate memory operation 105. The freed-up physical memory page is then mapped to the test at execute memory tests operation 107. Then, according to one embodiment of the invention, if the process/program from which the physical memory page was stolen tries to access the virtual memory (which does not have a backing physical memory page at this point) a normal page-in operation is performed by the Virtual Memory system to map the virtual memory page to another available physical memory page.

As discussed above, according to one embodiment of the invention, appropriate locking mechanisms are used to ensure that the physical memory pages under test at execute memory tests operation 107 are not paged-out by the Operating System. This also means that, according to one embodiment of the invention, there will be a small percentage of physical memory pages that cannot be "stolen" at allocate memory operation 105. These locked out physical memory pages are essentially the physical memory pages that are in use by the Operating System/kernel, or are otherwise locked, and cannot be paged-out. When the method of the invention comes across this type of locked out physical memory page that cannot be allocated, then, according to one embodiment of the invention, the physical memory page is skipped, however, in one embodiment, virtual address mapping is still maintained to be contiguous.

From execute memory tests operation 107, in-system memory test method 100 flows to release tested memory operation 109. At release tested memory operation 109, the portion of memory tested at memory test operation 107 is moved from the "private/under test" list in-system memory test method 100 back to the "public/system" list of the memory system, i.e., release tested memory operation 109 performs an operation opposite to the operation performed by allocate memory operation 105. Consequently, the portion of physical memory tested at memory test operation 107 is returned back into the memory system for normal computer system use.

At repeat after scheduled time operation 111, the operations of allocate memory operation 105 and execute memory tests operation 107 are repeated at predetermined intervals and test runs are scheduled to be executed in multiple iterations to cover 100% of the testable memory.

As discussed above, in accordance with one embodiment of the present invention, in-system memory testing method 100 includes transparently selecting and "stealing" a portion of physical memory from the memory system at allocate memory operation 105 for running memory tests, then running one or more of the numerous known memory system tests on the selected portion of physical memory at execute memory tests operation 107, and then inserting the selected, and now tested, portion of physical memory back into the system for normal application use at release tested memory operation 109. As discussed below, Inventor run simulations have shown that implementation of in-system memory testing method 100 significantly improves the system's ability to proactively detect and mange functional faults in system memory.

In addition, in contrast to prior art methods, in-system memory testing method 100 is deterministic and does not depend on computer/memory system load. In addition, in-system memory testing method 100 is compatible with any conventional prior art functional test algorithm for in-system memory testing. Since using in-system memory testing method 100 can be performed under real life system environmental conditions, in-system memory testing method 100 complements other test techniques like BIST/POST that are conventionally used only at the time of computer system boot up. In addition, in-system memory testing method 100 can be used in both offline and online environments. When in-system memory testing method 100 is used in online mode, in-system memory testing method 100 can reduce error detection latency of functional faults that may otherwise get logically masked and go undetected by a "read" based memory scrubber or other prior art methods. In-system memory testing method 100 is also capable of providing improved application availability, even in the presence of defects that can cause uncorrectable (multiple bit) errors.

In addition, as discussed above, one embodiment of in-system memory testing method 100 is a software based in-system memory testing method 100 that includes both offline mode testing, i.e., memory test when customer applications are not running, and online mode testing, i.e., memory testing when customer applications are being run concurrently. The prior art includes a significant number of publications disclosing prior art test algorithms to detect such faults and in-system memory testing method 100 includes the transformation of these algorithms for in-system software based memory test. Consequently, in-system memory testing method 100 requires no new test algorithms other than those known to those of skill in the art.

In addition, modified embodiments of allocate memory operation 105 of the invention are also capable of use with other system components and can be used for various other test/diagnostic applications such as: cache diagnostic testing; system interconnect testing; directed memory diagnostic testing; correlation of system error with ATE testing; and improved error diagnosis and various other system wide applications.

In addition to the attributes discussed above, in-system memory testing method 100 can also provide an efficient error handling mechanism. Error handling is especially important in online mode testing. Modern day Operating Systems, that run mission critical computers, are being designed with fault management capabilities. Put in simple terms, if an error is detected (say ECC) these operating systems can relate the error to a cause (fault) and attempt to isolate it from rest of the (operational) system. For example, in the case of correctable memory errors, the Operating System can transparently stop using the page of physical memory (page retirement) on which the faulty memory cell resides. The judgment to retire a page of physical memory can be based on a number of factors, like rate of errors, evaluation for a stuck at fault (by writing corrected data and reading it back), etc.

Given the huge size of physical memory configured in today's systems, page retirement under these conditions has little, or no, impact on the computer/memory system performance and can greatly improve system availability. However, on occurrence of an uncorrectable error, the data cannot, by definition, be corrected. Therefore, in addition to page retirement, the Operating System may be forced to kill the process requesting the data by sending a signal. This means that uncorrectable errors can still cause system application down time.

When used in online mode, in-system memory testing method 100 can reduce the probability of such down time by detecting single bit errors and preventing their conversion to multiple bit errors via a memory scrub or page retirement operation and detecting uncorrectable memory errors before they impact the system application. According to one embodiment of in-system memory testing method 100, retired pages need not be further tested until the faulty memory DIMM is replaced. Such DIMM replacement can typically wait until the next scheduled maintenance.

EXPERIMENTAL RESULTS

As discussed in more detail below, experimental results have shown that implementation of one embodiment of the in-system memory testing method of the invention can significantly improve the computer system's ability to proactively detect and mange functional faults in memory.

Different customer applications can have highly diverse system memory usage profile and performance requirements. Consequently, to evaluate any real improvement in system availability due to the use of an online test would require an unworkably long period of field deployment. Therefore, for the ease of evaluation of the in-system memory testing method of the invention, reduction in error detection latency could also be considered as a good indicator of the effectiveness of the in-system memory testing method of the invention.

Memory functional faults can get logically masked and stay undetected in a memory system for long periods of time. For example, even a simple stuck-at fault has 50% probability of staying undetected depending upon the state of data stored. More complex fault mechanisms like transient faults and linked faults have an even higher chance of getting masked. Such latent faults can develop during the operational life of the memory system and stay undetected for a long period of time before manifesting themselves. This fault manifestation could be related to a change in application, system load or other environmental changes etc. and can cause memory system or application down time. The inventors felt that if they could show that the in-system memory testing method of the present invention was more efficient at detecting such latent faults than even highly memory intensive general applications, then the in-system memory testing method of the present invention will have shown significant value added to the test in online mode. Detection of any DIMM faults that were undetected by POST/BIST would also indicate the effectiveness of the in-system memory testing method of the present invention in offline mode.

Software error injection techniques could not however be used in these experiments. It would take a simple read operation to detect a software-injected error (since the bit is already flipped by the error injector). Such techniques could only be used to verify the working of fault management software. For example, one could verify that a memory page was indeed retired if ECC errors were injected as per the page retirement criteria. Such verification is already a part the Operating System development process. The Inventors therefore limited the scope of the experiment to the evaluation of the in-system memory testing method of the present invention's effectiveness in finding real latent functional faults.

To this end, a sample of "suspect" memory DIMMs was collected over a period of time from a number of in-house computers running different application loads. These DIMMs were referred to as suspect because they were not proven to have a real hard fault. The DIMMs however had some history of previous ECC errors, although with a long MTBF (up to several days) and low error rate. These DIMMs were then tested through available POST (Power On Self Test) based system tests. DIMMs that failed during POST were rejected. Remaining DIMMs were used for the experiments. Next, using the principles of the present invention as discussed above, the inventors adapted Nair, Thatte, and Abraham's testing procedure for implementation of the in-system memory testing method of the present invention.

The above-mentioned DIMMs were then installed into a multiprocessor, a SUN Microsystems's platform, and the system was booted up with the Solaris™ (UNIX) Operating System. Two highly memory intensive applications were then run on the system for 24 hours each. The applications selected had high memory usage and adjusted according to the size of the memory installed in the system. Swap space was configured to be equal to main-memory size, ensuring that they would touch almost all of the available system memory. Additional system load was provided by running industry benchmarks like "linpack". System performance monitoring tools were also used to verify high load.

Next, the in-system memory testing method of the present invention was executed such that it would test all of available memory within same amount of time. The number of unique DIMMs that failed due to ECC errors in each run were noted.

Figure 2:
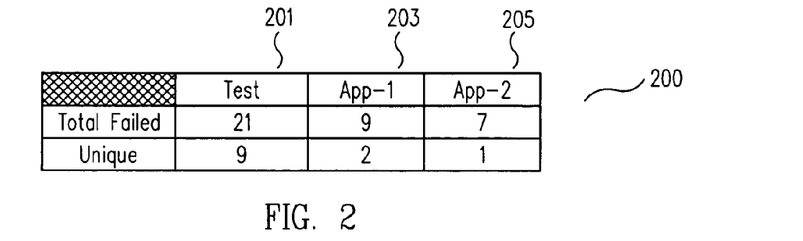
FIG. 2 presents, in tabular form, experimental results from a test run performed by the Inventors of one embodiment of an of in-system memory test method designed in accordance with the principles of the invention.

A total of 24 unique faulty DIMMs were detected during the experiment. FIG. 2 presents the experimental results in tabular form (Table 200 in FIG. 2). The in-system memory test method of the invention has been simply referred to as "test 201" and the two applications have been referred to as "app-1 203" and "app-2 205" respectively. Table 200 provides the total and unique faulty DIMMs detected by each test case.

Figure 3:
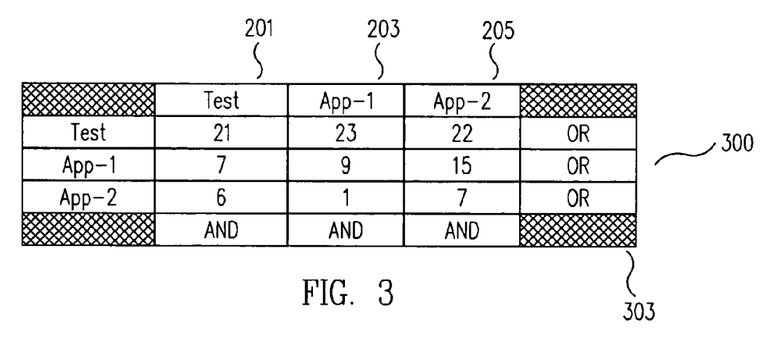
FIG. 3 presents, in tabular form, experimental results from a test run performed by the Inventors of one embodiment of an of in-system memory test method designed in accordance with the principles of the invention.

FIG. 3 includes Table 300 that provides intersection (AND) and union (OR) information about the DIMMs detected by different test cases. Intersections are provided below the diagonal that starts at the bottom right corner 303 of Table 300 and unions are provided above the diagonal. For example, 7 DIMMs were detected by both test 201 and the app-1 203, while 23 DIMMs were detected by either test 201 or app-1 203 or both.

Figure 4:
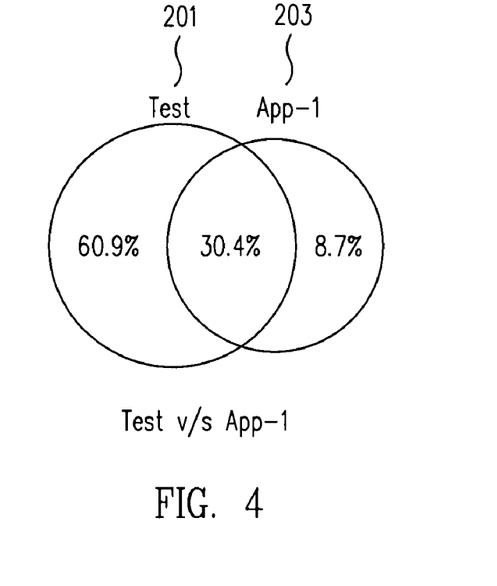
FIG. 4 presents, in Venn diagram form, experimental results from a test run performed by the Inventors of one embodiment of an of in-system memory test method designed in accordance with the principles of the invention.
Figure 5:
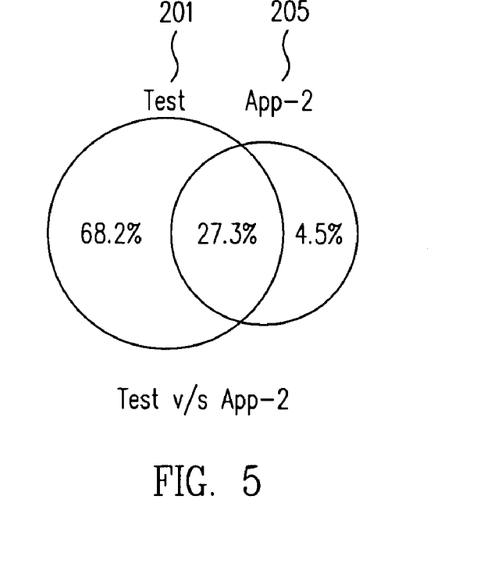
FIG. 5 presents, in Venn diagram form, experimental results from a test run performed by the Inventors of one embodiment of an of in-system memory test method designed in accordance with the principles of the invention.
Figure 6:
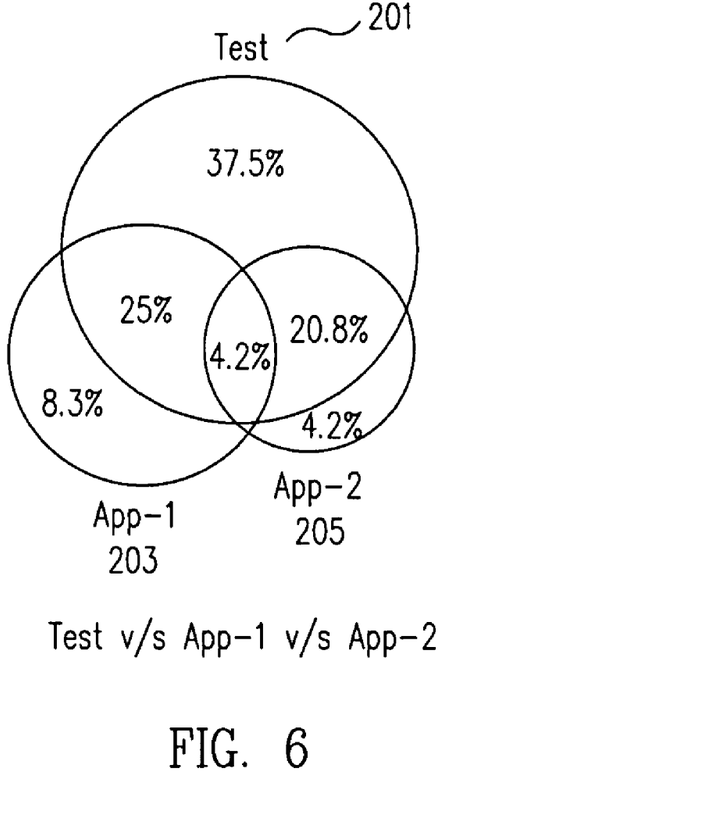
FIG. 6 presents, in Venn diagram form, experimental results from a test run performed by the Inventors of one embodiment of an of in-system memory test method designed in accordance with the principles of the invention.

To put these results into perspective, Venn diagram representation of the percentage of faulty DIMMs detected by the applications and one embodiment the in-system memory test of the invention are also provided. FIG. 4 compares test 201 and app-1 203, while FIG. 5 compares test 201 and app-2 203. FIG. 6 provides comparison among all the three test cases.

From FIGS. 4, 5, and 6, it can be seen that the in-system memory testing method of the present invention was able to detect significantly higher percentage of unique faults when compared to a single application at a time. From FIG. 6, one can see that a majority of the faults that were detected while running App-1 203, were not detected while running App-2 205 and vice versa. The Inventors believe that these results validate the claim that previously latent faults in the system can be exposed due to change in application and system load etc. Secondly, this indicates that the in-system memory testing method of the present invention can detect the failures much sooner than a normal application, thus reducing the error detection latency of existing functional faults in the system.

The comparison discussed above is for the highly used memory locations. Reduction in error detection latency would be much higher for memory locations that are not used for a prolonged period of time under normal application load. As mentioned above, using the in-system memory testing method of the invention, once faults are detected, they get managed by the Operating System, via page retirement. This effectively heals the memory system from the faults and DIMM replacement can typically wait till next scheduled maintenance window.

It should also be noted that with the fault management framework in place, correctable errors detected by the user application may also be harmless. Using the in-system memory testing method of the invention, these correctable errors have no visible impact on the application. The errors get scrubbed on detection and, if needed, the page can still be retired. The in-system memory testing method of the present invention adds maximum value in detecting uncorrectable errors and any errors on memory locations that are not used for a prolonged period of time. Each uncorrectable error detected by the in-system memory testing method of the present invention is one less application downtime opportunity and each correctable error detected is one less opportunity for error accumulation/degradation into uncorrectable error.

In order to provide high application availability that customers have come to expect, today's computer and memory systems need to be able to operate in a defective environment. The in-system memory testing method of the present invention described above represents a significant step in that direction. The in-system memory testing method of the present invention can improve system application availability by detecting the faults that may manifest only under specific stresses. In online mode the in-system memory testing method of the present invention can detect faults before they can impact application or system level availability. As discussed above, with fault management capabilities available in modern day operating systems, such faults can then be effectively "healed" by isolating the faulty hardware from rest of the operational system.

As discussed above, according to one embodiment, the in-system memory testing method of the present invention allows a software based in-system memory test to transparently "steal" a chunk of memory from the system and then insert it back for application's use after performing test operations. The size of the memory chunk to be tested can be varied from a single page (8 KB for Solaris™), to cover almost all of the available memory. The in-system memory testing method of the present invention is therefore suitable for both offline and online use. It has been shown that the in-system memory testing method of the present invention complements the coverage of existing tests like POST/BIST and ECC based passive tests. Being, in one embodiment, a software based solution, the in-system memory testing method of the present invention lends itself to easy deployment and is a low price alternative to hardware based solutions.

Although in-system memory testing method 100 of the invention is referred to simply as a method, this is illustrative only. In-system memory testing method 100 of the invention, in one embodiment, is a stand-alone application. In another embodiment, in-system memory testing method 100 is capable of being called from a parent application or the Operating System. In one embodiment, an application is generally defined to be any executable code. Moreover, those of skill in the art will understand that when it is said that an application or an operation takes some action, the action is the result of executing one or more instructions by a processor. In one embodiment, in-system memory testing method 100 is implemented as a system level, e.g., kernel mode driver.

While embodiments in accordance with the present invention have been described for specific illustrative configurations, an embodiment of the present invention may be carried out using any suitable hardware configuration or means involving a personal computer, a workstation, a portable device, or a network of computer devices. Other network configurations such as client-server configurations, peer-to-peer, web-based, intranet, internet network configurations, are used in other embodiments.

Herein, a computer program product comprises a medium configured to store or transport computer readable code in accordance with an embodiment of the present invention. Some examples of computer program products are CD-ROM discs, DVDs, ROM cards, floppy discs, magnetic tapes, computer hard drives, servers on a network and signals transmitted over a network representing computer readable code. This medium may belong to the computer system itself. However, the medium also may be removed from the computer system. For example, in-system memory testing method 100 may be stored in memory that is physically located in a location different from the processor or is portable. This could be accomplished in a client-server system, or alternatively via a connection to another computer via modems and analog lines, or digital interfaces and a digital carrier line.

More specifically, in one embodiment, in-system memory testing method 100 is stored and/or implemented in a portable computer, a workstation, a two-way pager, a cellular telephone, a digital wireless telephone, a personal digital assistant, a server computer, an Internet appliance, or any other device. In one embodiment, in-system memory testing method 100 is stored and/or implemented in/on multiple different computers, wireless devices, cellular telephones, digital telephones, two-way pagers, or personal digital assistants, server computers, or any desired combination of these devices that are interconnected to perform, the methods as described herein.

In view of this disclosure, the in-system memory testing method functionality in accordance with one embodiment of present invention can be implemented in a wide variety of computer system configurations. In addition, the in-system memory testing method functionality could be stored as different modules in memories of different devices.

In view of this disclosure, those of skill in the art can implement various embodiments of the present invention in a wide-variety of physical hardware configurations using an operating system and computer programming language of interest to the user.

In yet another embodiment, in-system memory testing method 100 is stored in the memory of a server system and in-system memory testing method 100 is transferred over a network to memory in a host computer system. In this embodiment, a network interface and I/O interface would include analog modems, digital modems, or a network interface card. If modems are used, the network includes a communications network, and in-system memory testing method 100 is downloaded via the communications network.

This disclosure provides exemplary embodiments of the present invention. The scope of the present invention is not limited by these exemplary embodiments. For example, for illustrative purposes, specific operations, and flow of operations, were described above and set forth in the FIGS. However, those of skill in the art will readily recognize that the operations, and flow of operations, can be varied to meet the specific user's needs and to accommodate differing implementations of the invention.

As another example, those of skill in the art will recognize that the organizational relationships of the in-system memory testing method 100 functions, such as 101, 103, 105, 107, 109 and 111, can be varied from application to application, and operating system environment to operating system environment. In addition, the number of functions can be more or less than the number of functions discussed above. Consequently the number of functions and the organizational relationships of the function discussed above were chosen for illustrative purposes only and are not intended to limit the invention in any way.

In addition, numerous variations, whether explicitly provided for by the specification or implied by the specification or not, such as variations in structure, dimension, type of material and manufacturing process may be implemented by one of skill in the art in view of this disclosure.

For instance, as discussed above, those of skill in the art will readily recognize that the choice of algorithms for use and incorporation with the invention at execute memory tests operation 107 is entirely dependent on the needs of the user and parent computer system.

As another example, the references to SUN Microsystems components, the Solaris™ operating system, or a Unix operating system was made for illustrative purposes only and the in-system memory testing method of the present invention is contemplated for use with any system components and/or operating systems with little or no modification.

In addition, as noted above, modified embodiments of allocate memory operation 105 of the invention are also capable of use with other system components and can be used for various other test/diagnostic applications such as: cache diagnostic testing; system interconnect testing; directed memory diagnostic testing; correlation of system error with ATE testing; and improved error diagnosis and various other system wide applications.

Consequently, numerous variations, whether explicitly provided for by the specification or implied by the specification or not, may be implemented by one of skill in the art in view of this disclosure.

What is claimed is:

1. A method for in-system memory testing comprising:
   probing a physical memory to determine the physical memory configuration including a base address of the physical memory the size of the entire physical memory;
   determining a size of a portion of physical memory to be tested in each iteration of testing of one or more iterations of testing to be performed to test the entire physical memory, the size of a portion of physical memory to be tested in each iteration of testing being determined by dividing the size of the entire physical memory by a total number of iterations to be performed to test the entire physical memory;
   selecting a first portion of physical memory for testing, thereby defining a selected first portion of physical memory, the selected first portion of physical memory being selected based on the iteration number associated with the testing of the selected first portion of physical memory, the size of a portion of physical memory to be tested in each iteration of testing and an allocated start address for the selected first portion of physical memory, the allocated start address for the selected first portion of physical memory being determined by adding the product of the size of a portion of physical memory to be tested in each iteration of testing and the iteration number associated with the testing of the selected first portion of physical memory to the base address of the physical memory;
   allocating a portion of virtual memory for testing, thereby defining an allocated portion of virtual memory;
   mapping the selected first portion of physical memory from the physical memory to the allocated portion of virtual memory; and
   executing a memory test algorithm on the selected first portion of physical memory mapped to the allocated portion of virtual memory, in the allocated portion of virtual memory.

2. The method for in-system memory testing of claim 1, further comprising:
   selecting a second portion of physical memory for testing, thereby defining a selected second portion of physical memory, the selected second portion of physical memory being selected based on the iteration number associated with the testing of the selected second portion of physical memory, the size of a portion of physical memory to be tested in each iteration of testing, and an allocated start address for the selected second portion of physical memory, the allocated start address for the selected second portion of physical memory being determined by adding the product of the size of a portion of physical memory to be tested in each iteration of testing and the iteration number associated with the testing of the selected second portion of physical memory to the base address of the physical memory;
   mapping the selected second portion of physical memory from the physical memory to the allocated portion of virtual memory; and
   executing a memory test algorithm on the selected second portion of physical memory mapped to the allocated portion of virtual memory, in the allocated portion of virtual memory.

3. The method for in-system memory testing of claim 2, further comprising:
   repeating:
      selecting a portion of physical memory for testing, thereby defining a selected portion of physical memory, the selected portion of physical memory being selected based on the iteration number associated with the testing of the selected portion of physical memory, the size of a portion of physical memory to be tested in each iteration of testing, and an allocated start address for the selected portion of physical memory, the allocated start address for the selected portion of physical memory being determined by adding the product of the size of a portion of physical memory to be tested in each iteration of testing and the iteration number associated with the testing of the selected portion of physical memory to the base address of the physical memory;
      mapping the selected portion of physical memory from the physical memory to the allocated portion of virtual memory, thereby defining an allocated portion of virtual memory; and
      executing a memory test algorithm on the selected portion of physical memory mapped to the allocated portion of virtual memory, in the allocated portion of virtual memory until the entire physical memory has been tested.

4. The method for in-system memory testing of claim 1, wherein:
   selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are performed in an offline environment.

5. The method for in-system memory testing of claim 1, wherein:

selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are performed in an online environment.

6. The method for in-system memory testing of claim 5, wherein:

selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are scheduled to be performed during system idle periods.

7. The method for in-system memory testing of claim 1, further comprising:

preventing an Operating System of a computer system using the physical memory being tested from paging-out the selected first portion of physical memory while the test algorithm is being executed on the selected first portion of physical memory.

8. A system for in-system memory testing comprising:

means for probing a physical memory to determine the physical memory configuration including a base address of the physical memory the size of the entire physical memory;

determining a size of a portion of physical memory to be tested in each iteration of testing of one or more iterations of testing to be performed to test the entire physical memory, the size of a portion of physical memory to be tested in each iteration of testing being determined by dividing the size of the entire physical memory by a total number of iterations to be performed to test the entire physical memory;

means for selecting a first portion of physical memory for testing, thereby defining a selected first portion of physical memory, the selected portion of physical memory being selected based on the iteration number associated with the testing of the selected first portion of physical memory, the size of a portion of physical memory to be tested in each iteration of testing and an allocated start address for the selected first portion of physical memory, the allocated start address for the selected first portion of physical memory being determined by adding the product of the size of a portion of physical memory to be tested in each iteration of testing and the iteration number associated with the testing of the selected first portion of physical memory to the base address of the physical memory;

means for allocating a portion of virtual memory for testing, thereby defining an allocated portion of virtual memory;

means for mapping the selected first portion of physical memory from the physical memory to the allocated portion of virtual memory; and means for executing a memory test algorithm on the selected first portion of physical memory mapped to the allocated portion of virtual memory, in the allocated portion of virtual memory.

9. The system for in-system memory testing of claim 8, further comprising:

means for selecting a second portion of physical memory for testing, thereby defining a selected second portion of physical memory, the selected second portion of physical memory being selected based on the iteration number associated with the testing of the selected second portion of physical memory, the size of a portion of physical memory to be tested in each iteration of testing, and an allocated start address for the selected second portion of physical memory, the allocated start address for the selected second portion of physical memory being determined by adding the product of the size of a portion of physical memory to be tested in each iteration of testing and the iteration number associated with the testing of the selected second portion of physical memory to the base address of the physical memory;

means for mapping the selected second portion of physical memory from the physical memory to the allocated portion of virtual memory; and means for executing a memory test algorithm on the selected second portion of physical memory mapped to the allocated portion of virtual memory, in the allocated portion of virtual memory.

10. The system for in-system memory testing of claim 9, further comprising:

means for repeating:

selecting a portion of physical memory for testing, thereby defining a selected portion of physical memory, the selected portion of physical memory being selected based on the iteration number associated with the testing of the selected portion of physical memory, the size of a portion of physical memory to be tested in each iteration of testing, and an allocated start address for the selected portion of physical memory, the allocated start address for the selected portion of physical memory being determined by adding the product of the size of a portion of physical memory to be tested in each iteration of testing and the iteration number associated with the testing of the selected portion of physical memory to the base address of the physical memory;

mapping the selected portion of physical memory from the physical memory to the allocated portion of virtual memory, thereby defining an allocated portion of virtual memory; and executing a memory test algorithm on the selected portion of physical memory mapped to the allocated portion of virtual memory, in the allocated portion of virtual memory until the entire physical memory has been tested.

11. The system for in-system memory testing of claim 8, further comprising:

means for preventing an Operating System of a computer system using the physical memory being tested from paging-out the selected first portion of physical memory while the test algorithm is being executed on the selected first portion of physical memory.

12. A computer program product comprising:

instructions for directing an in-system memory test, the in-system memory test comprising:

probing a physical memory to determine the physical memory configuration including a base address of the physical memory the size of the entire physical memory;

determining a size of a portion of physical memory to be tested in each iteration of testing of one or more iterations of testing to be performed to test the entire physical memory, the size of a portion of physical memory to be tested in each iteration of testing being determined by dividing the size of the entire physical memory by a total number of iterations to be performed to test the entire physical memory;

selecting a first portion of physical memory for testing, thereby defining a selected first portion of physical memory, the iteration number associated with the testing of the selected first portion of physical memory, the size of a portion of physical memory to be tested in each iteration of testing and an allocated start address for the selected first portion of physical memory, the allocated start address for the selected first portion of physical memory being determined by adding the product of the size of a portion of physical memory to be tested in each iteration of testing and the iteration number associated with the testing of the selected first portion of physical memory to the base address of the physical memory allocating a portion of virtual memory for testing, thereby defining an allocated portion of virtual memory;

mapping the selected first portion of physical memory from the physical memory to the allocated portion of virtual memory;

executing a memory test algorithm on the selected first portion of physical memory mapped to the allocated portion of virtual memory, in the allocated portion of virtual memory; and a computing system using the selected first portion of physical memory.

13. The computer program product of claim 12, wherein, the in-system memory test further comprises:

selecting a second portion of physical memory for testing, thereby defining a selected second portion of physical memory, the selected second portion of physical memory being selected based on the iteration number associated with the testing of the selected second portion of physical memory, the size of a portion of physical memory to be tested in each iteration of testing, and an allocated start address for the selected second portion of physical memory, the allocated start address for the selected second portion of physical memory being determined by adding the product of the size of a portion of physical memory to be tested in each iteration of testing and the iteration number associated with the testing of the selected second portion of physical memory to the base address of the physical memory;

mapping the selected second portion of physical memory from the physical memory to the allocated portion of virtual memory; and executing a memory test algorithm on the selected second portion of physical memory mapped to the allocated portion of virtual memory, in the allocated portion of virtual memory.

14. The computer program product of claim 13, wherein, the in-system memory test further comprises:

repeating:

selecting a portion of physical memory for testing, thereby defining a selected portion of physical memory, the selected portion of physical memory being selected based on the iteration number associated with the testing of the selected portion of physical memory, the size of a portion of physical memory to be tested in each iteration of testing, and an allocated start address for the selected portion of physical memory, the allocated start address for the selected portion of physical memory being determined by adding the product of the size of a portion of physical memory to be tested in each iteration of testing and the iteration number associated with the testing of the selected portion of physical memory to the base address of the physical memory;

mapping the selected portion of physical memory from the physical memory to the allocated portion of virtual memory, thereby defining an allocated portion of virtual memory; and executing a memory test algorithm on the selected portion of physical memory mapped to the allocated portion of virtual memory, in the allocated portion of virtual memory until the entire physical memory has been tested.

15. The computer program product of claim 12, wherein, the in-system memory test further comprises:

selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are performed in an offline environment.

16. The computer program product of claim 12, wherein, the in-system memory test further comprises:

selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are performed in an online environment.

17. The computer program product of claim 12, wherein, the in-system memory test further comprises:

selecting a first portion of physical memory for testing, thereby defining a selected first portion of physical memory;

mapping the selected first portion of physical memory from the physical memory to the allocated portion of virtual memory; and executing a memory test algorithm on the selected first portion of physical memory in the allocated portion of virtual memory are scheduled to be performed during system idle periods.

18. The computer program product of claim 12, wherein, the in-system memory test further comprises:

preventing an Operating System of a computer system using the physical memory being tested from paging-out the selected first portion of physical memory while the test algorithm is being executed on the selected first portion of physical memory.

* * * * *